(12) United States Patent
Lu

(10) Patent No.: US 8,074,705 B2
(45) Date of Patent: Dec. 13, 2011

(54) HEAT DISSIPATION DEVICE HAVING FASTENER ASSEMBLIES FOR ATTACHMENT THEREOF TO A HEAT-GENERATING COMPONENT

(75) Inventor: Cui-Jun Lu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 790 days.

(21) Appl. No.: 12/147,520

(22) Filed: Jun. 27, 2008

(65) Prior Publication Data
US 2009/0266512 A1 Oct. 29, 2009

(30) Foreign Application Priority Data

Apr. 25, 2008 (CN) .......................... 2008 1 0066798

(51) Int. Cl.
*F28F 7/00* (2006.01)
*H05K 7/20* (2006.01)
(52) U.S. Cl. ......................................... 165/80.3; 165/67
(58) Field of Classification Search ................ 165/80.3, 165/185, 104.33, 67, 76, 79, 104.21; 361/679.58, 361/704, 709, 700; 257/718, 719; 248/510
See application file for complete search history.

(56) References Cited

U.S. PATENT DOCUMENTS

| | | | | |
|---|---|---|---|---|
| 6,317,328 B1 * | 11/2001 | Su | ................... | 361/704 |
| 6,611,431 B1 * | 8/2003 | Lee et al. | ....................... | 361/719 |
| 7,262,969 B2 * | 8/2007 | Lee et al. | ....................... | 361/704 |
| 7,342,795 B2 * | 3/2008 | Lee et al. | ....................... | 361/719 |
| 7,606,031 B2 * | 10/2009 | Hsieh et al. | ................... | 361/700 |
| 7,606,032 B2 * | 10/2009 | Lin | ................... | 361/709 |
| 2006/0137861 A1 * | 6/2006 | Wang et al. | ............. | 165/104.33 |
| 2006/0245165 A1 * | 11/2006 | Lin | ................... | 361/704 |
| 2007/0242439 A1 * | 10/2007 | Lu et al. | ....................... | 361/719 |

* cited by examiner

*Primary Examiner* — Tho V Duong
(74) *Attorney, Agent, or Firm* — Altis Law Group, Inc.

(57) ABSTRACT

A fastener assembly for securing a heat sink to a printed circuit board, includes a sleeve, a bolt inserted into the sleeve and a resilient component surrounding the bolt. The sleeve comprises a hollow body, a bottom plate at a bottom thereof and an engaging cylinder extending downwardly from the bottom plate. The engaging cylinder has inner thread and a deformable latching protrusion projecting radially outwardly. The bolt includes a shaft, a head and a threaded part for threadedly engaging with a retainer of the printed circuit board. The head is received in the sleeve above the bottom plate. The shaft is received in the through hole of the sleeve whilst the threaded part is held beneath the engaging cylinder of the sleeve. The resilient component is compressed between the head of the bolt and the bottom plate of the sleeve.

16 Claims, 4 Drawing Sheets

HEAT DISSIPATION DEVICE HAVING FASTENER ASSEMBLIES FOR ATTACHMENT THEREOF TO A HEAT-GENERATING COMPONENT

BACKGROUND

1. Field of the Invention

The present invention relates to a heat dissipation device and more particularly to a heat dissipation device having fastener assemblies for attaching the heat dissipating device to a heat-generating component.

2. Description of Related Art

A heat sink is usually placed in thermal contact with an electronic package, such as a central processing unit (CPU), to transfer heat through conduction away from the electronic package, thus preventing over-heating of the electronic package. One apparatus for attaching the heat sink on the CPU includes four through holes defined in four corners of the heat sink, four threaded holes defined in a retainer, four screws, and four springs. The screws are pushed to extend through the springs and the through holes of the heat sink and a motherboard in order to engage into the threaded holes of the retainer, thereby attaching the heat sink onto the CPU mounted on the motherboard.

However, since the screws and the springs are discrete components prior to attachment of the heat sink onto the motherboard, the individual screws and springs are all easily to fall to the motherboard unexpectedly during the attachment and detachment of the heat sink to/from the motherboard. Additionally, in mass production, the assembly process of the screws and the springs can be time-consuming and inconvenient.

Therefore, a heat dissipation device having improved fastener assemblies for securing a heat sink to a heat-generating component, which overcomes the above-mentioned disadvantages is desired.

SUMMARY

A fastener assembly for securing a heat sink to a printed circuit board, includes a sleeve, a bolt inserted into the sleeve and a resilient component surrounding the bolt. The sleeve comprises a hollow body, a bottom plate at a bottom thereof and an engaging cylinder extending downwardly from the bottom plate. The engaging cylinder defines therein a through hole communicating with the hollow body and has at least one latching protrusion projecting outwardly. The bolt comprises a shaft, a head at an end of the shaft and a threaded part formed at an opposite end thereof adapted for threadedly engaging with a retainer of the printed circuit board. The head is received in the sleeve above the bottom plate. The shaft is received in the through hole of the sleeve whilst the threaded part is held beneath the engaging cylinder of the sleeve. The resilient component is compressed between the head of the bolt and the bottom plate of the sleeve.

Other advantages and novel features of the present invention will become more apparent from the following detailed description of an embodiment/embodiments when taken in conjunction with the accompanying drawings, in which:

DETAILED DESCRIPTION

Figure 1:
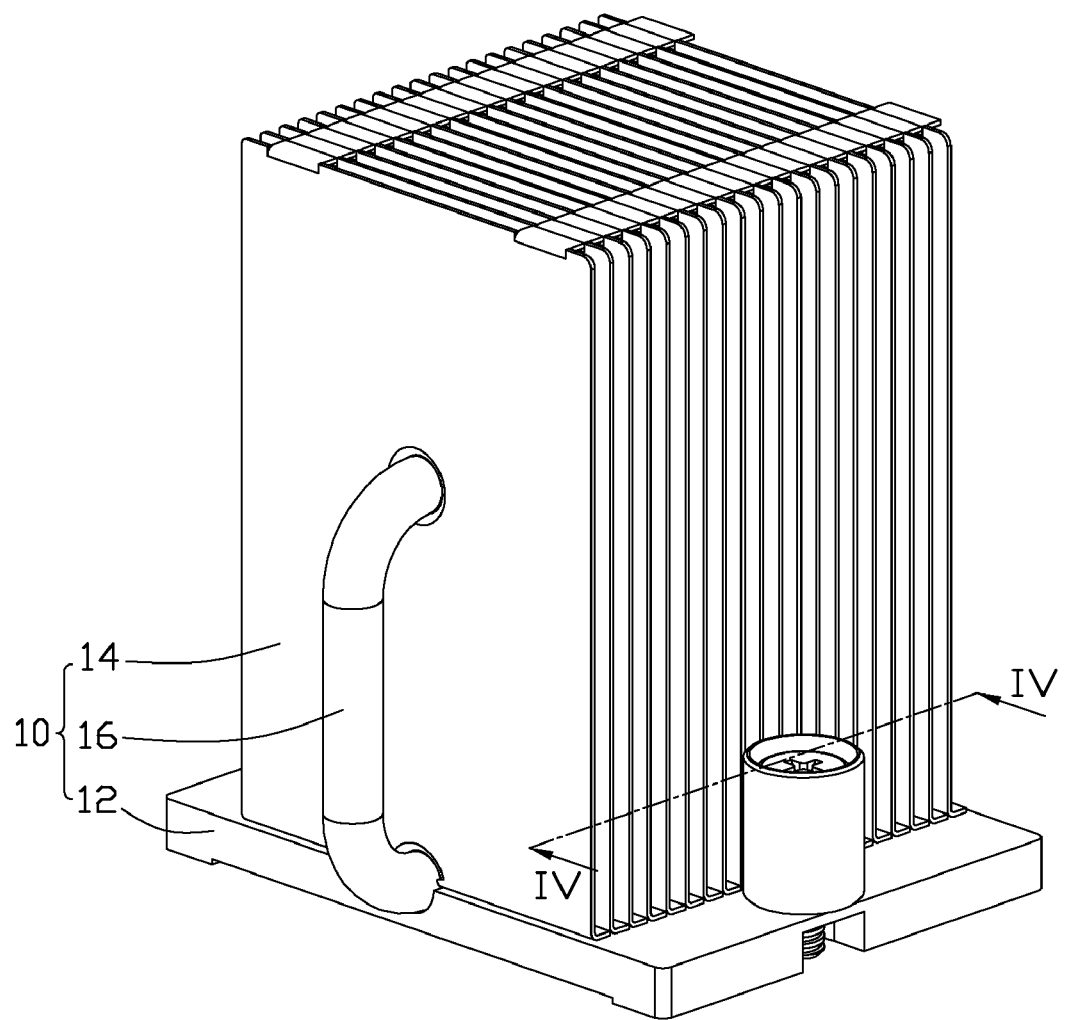
FIG. 1 is an assembled view of a heat dissipation device in accordance with a preferred embodiment of the present invention.
Figure 2:
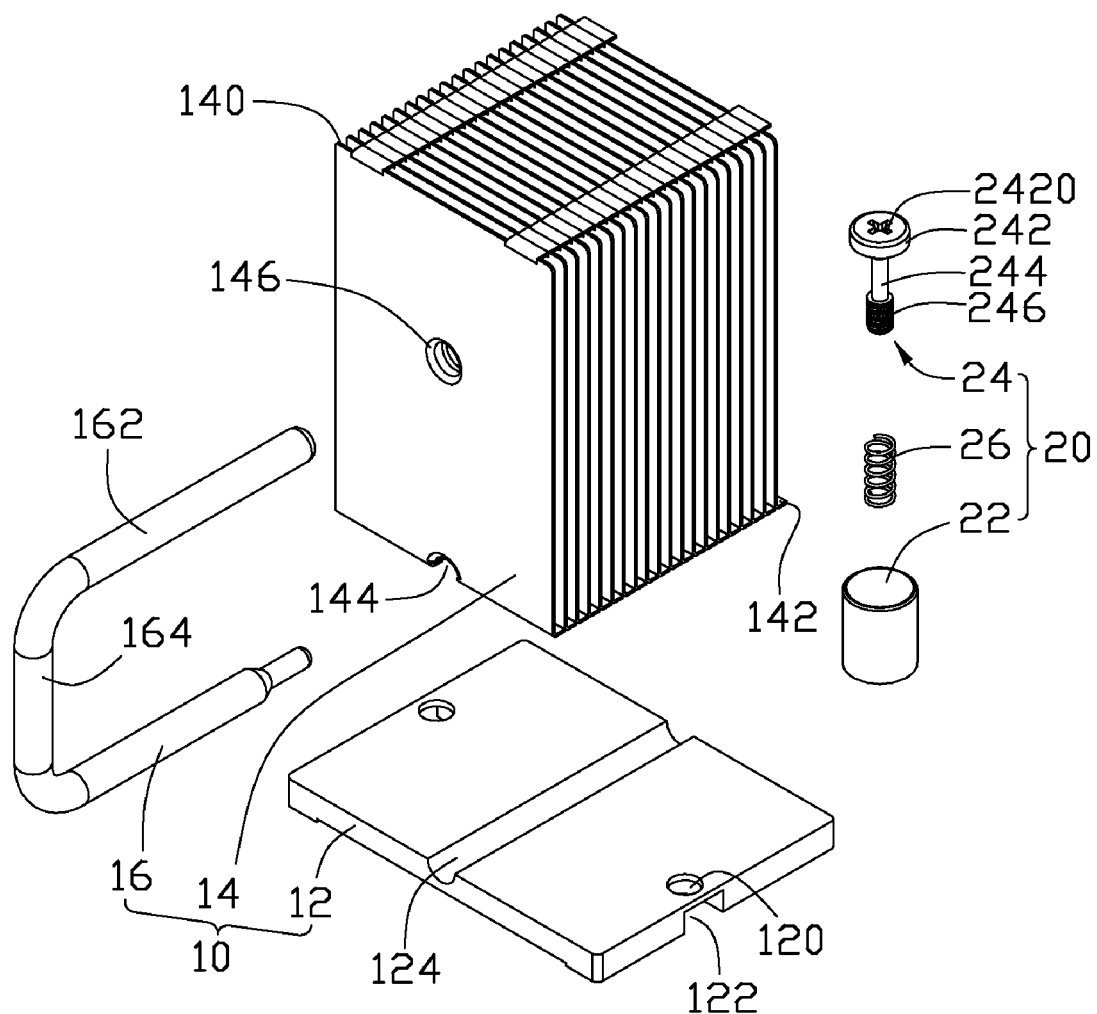
FIG. 2 is an exploded view of the heat dissipation device in FIG. 1.

Referring to FIGS. 1 and 2, a heat dissipation device in accordance with a preferred embodiment of the present invention is illustrated. The heat dissipation device includes a heat sink 10 for removing heat from a heat-generating component such as CPU (not shown) mounted on a printed circuit board (not shown) and a pair of fastener assemblies 20 for attaching the heat sink 10 onto the heat-generating component.

The heat sink 10 comprises a base plate 12 for contacting with a top surface of the CPU, a fin set 14 mounted on a top surface of the base plate 12 and a heat pipe 16 thermally connecting the base plate 12 and the fin set 14 together.

The base plate 12 is rectangular and defines therein two mounting holes 120 located respectively adjacent to middle portions of two opposite lateral sides thereof. The base plate 12 defines two cutouts 122 recessed from a bottom surface thereof, which are respectively located under the two mounting holes 120 and communicate with the two lateral sides of the base plate 12, whereby a thickness of the base plate 12 around the two mounting holes 120 is much smaller than that of other part of the base plate 12. The base plate 12 defines an elongated first groove 124 in a middle portion of the top surface thereof, which is parallel to the two lateral sides of the base plate 12 and perpendicular to the cutouts 122.

The fin set 14 comprises a plurality of rectangular fins 140 which are arranged on the top surface of the base plate 12 and perpendicular to the top surface and the two lateral sides of the base plate 12. Each of the fins 140 has a flange 142 perpendicularly bent from a lower edge thereof. All the flanges 142 of the fin set 14 are juxtaposed closely to each other, to thereby cooperatively define a continuous flat bottom surface of the fin set 14 which is fix to the top surface of the base plate 12 by soldering or adhering. The fin set 14 defines an elongated second groove 144 in a middle portion of the bottom surface thereof and a second receiving hole 146 above the second groove 144. The second groove 144 is corresponding to and cooperates with the first groove 124 of the base plate 12 to define a first receiving hole (not labeled) for receiving a lower portion (i.e., an evaporation portion) of the heat pipe 16. The second receiving hole 146 is parallel to the first receiving groove, extends through the fins 140 and is provided for receiving an upper portion (i.e., a condensation portion) of the heat pipe 16.

The heat pipe 16 is U-shaped and comprises two spaced horizontal portions 162 parallel to each other and a vertical portion 164 perpendicularly interconnecting the two horizontal portions 162. A lower one of the horizontal portions 162 is received in the first receiving hole cooperatively formed by the first groove 124 of the base plate 12 and the second groove 144 of the fin set 14. An upper one of the horizontal portions 162 is received in the second receiving hole 146. The vertical portion 164 is located to a front side of the fin set 14 and parallel to the fins 140.

The fastener assemblies 20 are respectively fixed in the mounting holes 120 of the base plate 12 and each comprise a sleeve 22, a bolt 24 inserted into the sleeve 22 and a resilient component, such as a coil spring 26 encircling the bolt 24 and received in the sleeve 22.

Figure 3:
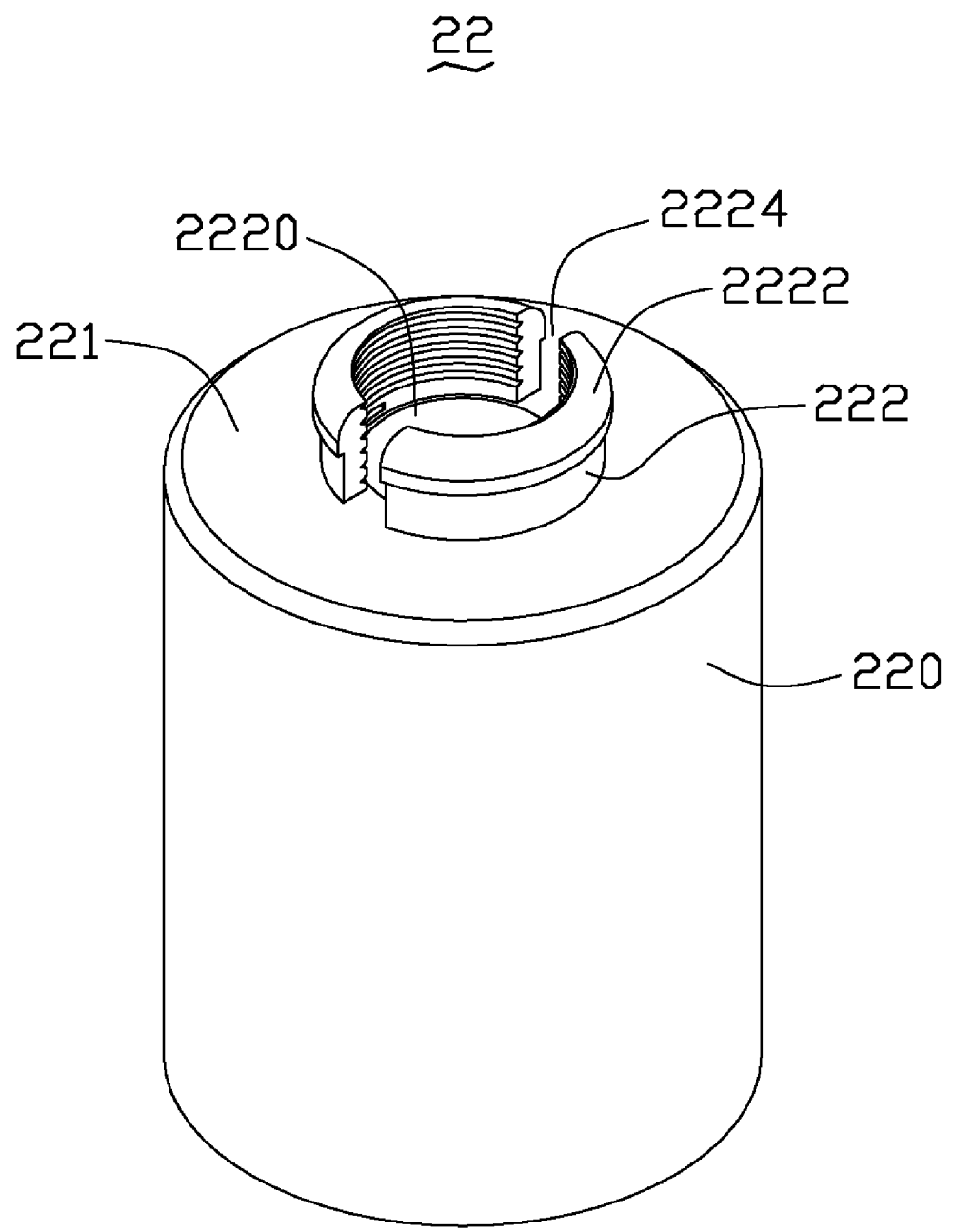
FIG. 3 is an inverted, enlarged view of a sleeve of a fastener assembly of the heat dissipation device in FIG. 2.

Particularly referring to FIG. 3, the sleeve 22 is formed from a molded elastic plastic, and comprises an elongated hollow body 220, an annular bottom plate 221 at a bottom of the hollow body 220 and an engaging cylinder 222 extending downwardly from a centre of a bottom surface of the bottom plate 221. Also referring to FIG. 4, the hollow body 220 comprises an upper part 2202, a lower part 2204 having an inner caliber smaller than that of the upper part 2202 in a manner such that an annular step 2203 is formed at a joint of inner walls of the upper and lower parts 2202, 2204. The engaging cylinder 222 extends perpendicularly from an inner rim of the annular bottom plate 221, cooperates with the bottom plate 221 to define a through hole 2220 in a centre thereof for allowing the bolt 24 to extend therethrough. The engaging cylinder 222 defines screw thread in an inner wall thereof for engaging with the bolt 24 and two vertical strip-shaped slots 2224 at two opposite places along a diametrical direction for providing elasticity to the engaging cylinder 222 of the sleeve 22. The engaging cylinder 222 has two latching protrusions 2222 projecting outwardly and radially from a lower end thereof for abutting against the bottom edge around the mounting hole 120 of the base plate 12 when the engaging cylinder 222 is fully inserted into the mounting hole 120 of the base plate 12 to hold the sleeve 22 in place. The latching protrusion 2222 is a part of a ring and has a flat step surface in a top thereof for snugly abutting against the bottom surface of the base plate 12 and a tapered lower portion having an outer diameter decreasing gradually in a direction from the top toward a bottom of the engaging cylinder 222 for facilitating an insertion of the engaging cylinder 222 downwardly into the mounting hole 120 of the base plate 12.

The bolt 24 is made of metal and has a head 242, a shaft 244 extending perpendicularly and downwardly from a bottom of the head 242, and a threaded part 246 at a bottom end of the shaft 244. The head 242 is column-shaped, has an outer diameter smaller than the inner caliber of the upper part 2202 of the sleeve 22 but bigger than the inner caliber of the lower part 2204 of the sleeve 22 and defines a cross-shaped slot 2420 in a top surface thereof for receiving a screw driver to rotate the bolt 24.

To assemble the fastener assembly 20, the threaded part 246 of the shaft 244 is extended through the spring 26 and then inserted into the sleeve 22. The threaded part 246 is screwed downwardly to screw with the screw thread of the engaging cylinder 222 of the sleeve 22. Finally, the threaded part 246 is threadedly moved through the engaging cylinder 222 until a top of the threaded part 246 engages the bottom of the engaging cylinder 222. Thus, the threaded part 246 is held below the engaging cylinder 222 and the spring 26 surrounding the shaft 244 is compressed between the head 242 of the bolt 24 and the bottom plate 221 of the sleeve 22, and the bolt 24 and the spring 26 are therefore assembled to the sleeve 22.

Figure 4:
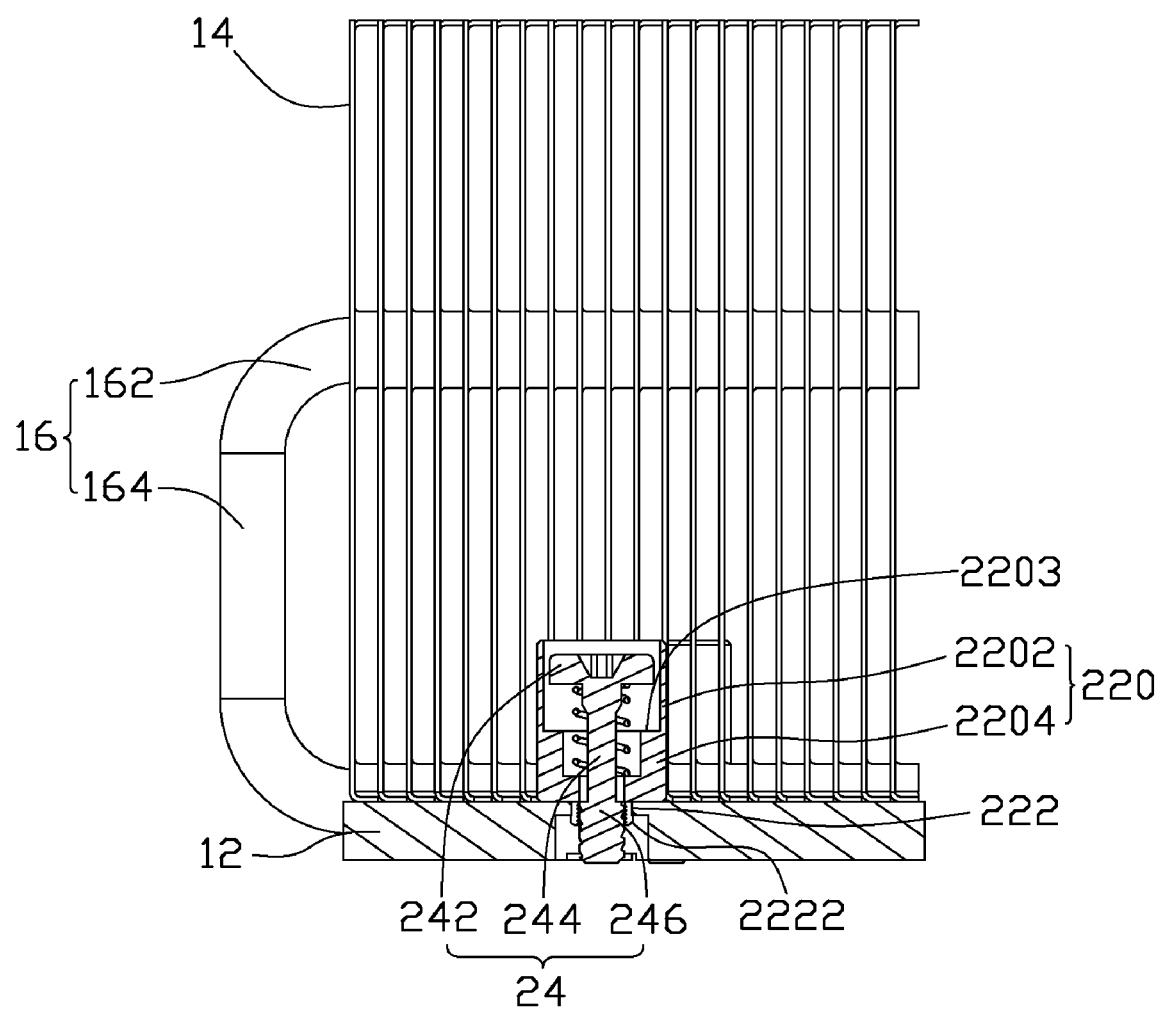
FIG. 4 is a cross-sectional view of the heat dissipation device taken from a line IV-IV in FIG. 1.

Also referring to FIG. 4, in the process of mounting the fastener assemblies 20 to the base plate 12 of the heat sink 10, the pre-assembled fastener assemblies 20 are installed into the associated mounting holes 120 of the base plate 12, with the bottoms of the engaging cylinders 222 of the sleeves 22 resting on the top surface of the base plate 12 at the mounting holes 120. The sleeves 22 are then pressed downwards to force the latching protrusion 2222 of the engaging cylinder 222 to move inwards to pass through the mounting holes 120 of the base plate 12. Subsequently, the latching protrusions 2222 return to their original states and are locked beneath the base plate 12 to securely hold the fastener assemblies 20 onto the heat sink 10. The fastener assemblies 20 are thus mounted to the heat sink 10. Thus, the springs 26 and the bolts 24 are all pre-assembled to the heat sink 10 before the heat sink 10 is assembled to the printed circuit board. Thus, the disadvantages of the prior art that the springs and bolts may fall onto the printed circuit board during the assembly of the heat sink to the printed circuit board can be avoided by the present invention. To secure the heat sink 10 to the CPU mounted on the printed circuit board, the threaded parts 246 of the bolts 24 of the fastener assemblies 20 are screwed downwards to engage a retainer, i.e., a back plate (not shown) located beneath the printed circuit board, so as to firmly secure the heat sink 10 on the printed circuit board, whereby a bottom surface of the base plate 12 can have an intimate contact with the CPU.

As described above, the fastener assembly 20 is pre-assembled to form a module. Installation or removal of the fastener assembly 20 is thus both quick and simple. Additionally, the springs 26 serve to lessen vibrations; therefore, the heat dissipating device can be securely fastened in the desired position on the printed circuit board and will not be unduly subjected to vibration.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fastener assembly for securing a heat sink to a printed circuit board, the fastener assembly comprising:
    a sleeve comprising a hollow body, a bottom plate at a bottom thereof and an engaging cylinder extending downwardly from the bottom plate, wherein the engaging cylinder therein defines a through hole communicating with the hollow body and has at least one latching protrusion projecting outwardly, and wherein the at least one latching protrusion has a flat annular surface in a top thereof and a tapered lower portion having an outer diameter decreasing gradually in a direction from the top toward a bottom of the engaging cylinder;
    a bolt comprising a shaft, a head at an end of the shaft and a threaded part formed at an opposite end thereof adapted for threadedly engaging with a retainer of the printed circuit board, the head being received in the sleeve above the bottom plate, the shaft being received in the through hole of the sleeve whilst the threaded part is held beneath the engaging cylinder of the sleeve; and
    a resilient component held between the head of the bolt and the bottom plate of the sleeve.

2. The fastener assembly as claimed in claim 1, wherein the engaging cylinder defines at least one slot at a sidewall thereof for providing elasticity to the engaging cylinder of the sleeve.

3. The fastener assembly as claimed in claim 2, wherein the at least one slot includes two vertical, strip-shaped slots in two opposite places of the engaging cylinder along a diametrical direction thereof.

4. The fastener assembly as claimed in claim 1, wherein the engaging cylinder extends perpendicularly from a center of a bottom of the bottom plate and defines a screw thread in an inner wall thereof for allowing the threaded part of the bolt to be threadedly moved therethrough.

5. The fastener assembly as claimed in claim 1, wherein the hollow body comprises an upper part, a lower part having an inner caliber smaller than that of the upper part, and an annular step connecting inner walls of the upper and lower parts.

6. The fastener assembly as claimed in claim 4, wherein the resilient component is a coil spring encircling the shaft, deformable axially along a length of the sleeve and sandwiched between the head of the shaft and the bottom plate of the hollow body.

7. A heat dissipation device, comprising:
a heat sink comprising a base plate and a fin set fixed on the base plate, the base plate defining a plurality of mounting holes therein; and
a plurality of pre-assembled fastener assemblies respectively installed in the mounting holes of the heat dissipating device, each fastener assembly comprising:
a sleeve comprising a hollow body, a bottom plate at a bottom thereof and an engaging cylinder which extends downwardly from the bottom plate and is received in a corresponding mounting hole of the base plate, the bottom of the bottom plate of the sleeve rested on a bottom surface of the base plate around the corresponding mounting hole, the engaging cylinder defining therein a through hole communicating with the hollow body and having at least one latching protrusion which projects radially and outwardly from the engaging cylinder and is locked with a bottom of the base plate;
a bolt comprising a shaft, a head at an end of the shaft and a threaded part formed at an opposite end thereof adapted for threadedly engaging with a retainer of a printed circuit board, the head being received in the sleeve above the bottom plate, the shaft being received in the through hole of the sleeve whilst the threaded part is held beneath the engaging cylinder of the sleeve; and
a resilient component held between the head of the bolt and the bottom plate of the sleeve.

8. The heat dissipation device as claimed in claim 7, wherein the engaging cylinder defines two vertical strip-shaped slots at two opposite places along a diametrical direction thereof, for providing elasticity to the engaging cylinder of the sleeve.

9. The heat dissipation device as claimed in claim 7, wherein the at least one latching protrusion has a flat annular surface in a top thereof which abuts against a bottom surface of the base plate around the corresponding mounting hole and a tapered lower portion having an outer diameter decreasing gradually in a direction from the top toward a bottom of the engaging cylinder.

10. The heat dissipation device as claimed in claim 7, wherein the engaging cylinder extends perpendicularly from a center of a bottom of the bottom plate and defines a screw thread in an inner wall thereof for allowing the threaded part of the bolt to be threadedly moved therethrough.

11. The heat dissipation device as claimed in claim 7, wherein the hollow body comprises an upper part, a lower part having an inner caliber smaller than that of the upper part, and an annular step connecting inner walls of the upper and lower parts.

12. The heat dissipation device as claimed in claim 11, wherein the resilient component is a coil spring encircling the shaft, deformable axially along a length of the sleeve and sandwiched between the head of the shaft and the bottom plate of the hollow body.

13. The heat dissipation device as claimed in claim 7, wherein the base plate defines two cutouts in a bottom surface thereof, which are respectively located under and around the mounting holes, whereby a thickness of the base plate around the mounting holes is smaller than that of other parts of the base plate.

14. The heat dissipation device as claimed in claim 7, wherein the fin set comprises a plurality of fins arranged vertically on the base plate and has a plurality of flanges which extend perpendicularly from lower ends of the fins and cooperatively form a continuous flat bottom surface.

15. The heat dissipation device as claimed in claim 7, further comprising a heat pipe having two parallel horizontal portions and a vertical portion interconnecting the two horizontal portions, wherein a lower one of the horizontal portions is sandwiched between the fin set and the base plate whilst an upper one of the horizontal portions extends through a part of the fin set above the lower one of the horizontal portions of the heat pipe.

16. A heat dissipation device, comprising:
a heat sink comprising a base plate and a fin set fixed on the base plate, the base plate defining a plurality of mounting holes therein; and
a plurality of pre-assembled fastener assemblies respectively installed in the mounting holes of the base plate, each fastener assembly comprising:
a sleeve comprising a hollow body, a bottom plate at a bottom thereof and an engaging cylinder which extends downwardly from the bottom plate and is received in a corresponding mounting hole of the base plate, the engaging cylinder defining therein a through hole communicating with the hollow body and having at least one latching protrusion which projects radially and outwardly from the engaging cylinder and is locked with a bottom of the base plate, the at least one latching protrusion having a flat annular surface in a top thereof which abuts against a bottom surface of the base plate around the corresponding mounting hole and a tapered lower portion having an outer diameter decreasing gradually in a direction from the top toward a bottom of the engaging cylinder;
a bolt comprising a shaft, a head at an end of the shaft and a threaded part formed at an opposite end thereof adapted for threadedly engaging with a retainer of a printed circuit board, the head being received in the sleeve above the bottom plate, the shaft being received in the through hole of the sleeve whilst the threaded part is held beneath the engaging cylinder of the sleeve; and
a resilient component held between the head of the bolt and the bottom plate of the sleeve.

* * * * *